(12) United States Patent
Shivaram et al.

(10) Patent No.: US 12,345,755 B2
(45) Date of Patent: Jul. 1, 2025

(54) REVERSE RECOVERY MEASUREMENTS AND PLOTS

(71) Applicant: Tektronix, Inc., Beaverton, OR (US)

(72) Inventors: Vivek Shivaram, Bangalore (IN);
Niranjan R Hegde, Siddapur (IN);
Parjanya Adiga, Bengaluru (IN);
Krishna N H Sri, Bengaluru (IN);
Tsuyoshi Miyazaki, Kawaguchi (JP);
Yogesh M. Pai, Bengaluru (IN);
Venkatraj Melinamane, Bangalore (IN)

(73) Assignee: Tektronix, Inc., Beaverton, OR (US)

( * ) Notice: Subject to any disclaimer, the term of this patent is extended or adjusted under 35 U.S.C. 154(b) by 198 days.

(21) Appl. No.: 17/976,644

(22) Filed: Oct. 28, 2022

(65) Prior Publication Data
US 2023/0133047 A1    May 4, 2023

(30) Foreign Application Priority Data
Nov. 1, 2021    (IN)    ............................. 202121050042

(51) Int. Cl.
*G01R 31/28*    (2006.01)
(52) U.S. Cl.
CPC ..... *G01R 31/2801* (2013.01); *G01R 31/2834* (2013.01)

(58) Field of Classification Search
None
See application file for complete search history.

(56) References Cited

U.S. PATENT DOCUMENTS

| | | | |
|---|---|---|---|
| 2014/0343883 A1* | 11/2014 | Libby ................. | G01R 13/029 702/68 |
| 2015/0032393 A1* | 1/2015 | Sri ..................... | G01R 31/2617 702/58 |
| 2023/0133743 A1* | 5/2023 | Shivaram ........... | G01R 31/2834 324/762.01 |
| 2024/0044968 A1* | 2/2024 | Shivaram ........... | G01R 31/2889 |

\* cited by examiner

*Primary Examiner* — Jermele M Hollington
(74) *Attorney, Agent, or Firm* — Miller Nash LLP; Andrew J. Harrington

(57) ABSTRACT

A test and measurement instrument has a user interface, one or more probes to connect to a device under test (DUT), and one or more processors to: receive waveform data from the DUT, locate one or more reverse recovery regions in the waveform data, determine a reverse recovery time for the DUT from the reverse recovery region, and display a reverse recovery plot of the one or more reverse recovery regions on the user interface. A method of providing reverse recovery measurements for a device under test (DUT) includes receiving waveform data through one or more probes from the DUT, locating one or more reverse recovery regions in the waveform data, determining a reverse recovery time for the DUT for the one or more reverse recovery regions, and displaying a reverse recovery plot of the one or more reverse recovery regions on the user interface.

16 Claims, 17 Drawing Sheets

REVERSE RECOVERY MEASUREMENTS AND PLOTS

CROSS-REFERENCE TO RELATED APPLICATIONS

This disclosure claims benefit of Indian Provisional Application No. 202121050042, titled "Automated Double Pulse Test (DPT) Measurements with Reverse Recovery Plot for System Validation of Wide Brand Gap (WBG) Power Devices During In-Circuit Operation," filed on Nov. 1, 2022, the disclosure of which is incorporated herein by reference in its entirety.

TECHNICAL FIELD

The present disclosure relates to test and measurement of semiconductor based power devices.

BACKGROUND

Semiconductor materials used in power electronics are transitioning from silicon to Wide Band Gap (WBG) semiconductors such as silicon carbide (SiC) and gallium nitride (GaN) due to their superior performance at higher power levels in automotive and industrial applications.

The GaN and SiC technologies enable smaller, faster, and more efficient designs. Fully validating a SiC or GaN-based WBG device requires both static and dynamic measurements. The preferred test method to measure the switching and diode reverse parameters of MOSFETs or IGBTs is commonly performed using the Double Pulse Test (DPT) method.

The WBG system validation is performed by comparing real time waveforms during DPT experiments across a range of operating conditions for a wide range of voltage and thermal values.

The DPT is a well-defined method to measure the switching parameters and evaluate the dynamic behaviors of power devices.

The IEC and JEDEC standards define the dynamic testing of WBG power devices. The DPT helps to determine key performance parameters of the switching device by the following measurements: Switching parameters, Diode reverse recovery energy and time, Gate charge, and Capacitance analysis.

Customers perform the in-circuit operation of the DUT board without an external stimulus and characterize the discrete MOSFET/IGBT components earlier in the workflow. The in-circuit testing depicts the real scenario of DUT operation and is sometimes referred to as system validation. There are no standard measurements or test procedure to test the DUT at the system validation stage.

With conventional DPT setups, it is a time-consuming and error-prone process to manually conduct these tests under several permutations of test parameters and thereafter analyze the experimental data manually Presently, the customers test the WBG devices by manually saving the waveforms, exporting to tools like Excel or LabVIEW; running their proprietary techniques and document the test reports; and iterating across multiple DUTs (10 s to 20 s). Delays in projects also lead to delayed time to market, and loss of key customers to competitors.

One of the key challenges faced by the customers during system validation of WBG reference designs is to improve testing times. It takes longer time to capture real time waveforms and analyze over multiple runs. It takes a couple of days to validate and test just one power device. The key attributes are multiple measurements to make, multiple DUTs to test; manual testing, analysis, and reporting that causes delays.

Another key challenge is the lack of confidence in test results. DPT testing needs automated measurements and control of instruments such as AFG, DUT board and measurement system (scope) during dynamic testing because test engineers use their own code or tools for analysis leading to ineffective control of test setups, probes do not satisfy bandwidth, dynamic range, common mode rejection ratio needs, and oscilloscopes need to have multi-channel, with de-skewing capability and high dynamic range.

Homebrewed solution is predominant in this space and is a customized setup that varies from company to company. Although it has fair coverage around the measurements, from a system standpoint, there is no standard—as the technique and implementation can vary from company to company, and setup to setup. This leads to low confidence in the test setup and poses challenge with result correlation. There is no standard and accepted solution available to validate in-circuit operation of the DUT.

Existing test methods from T&M vendors do not have dedicated scope-based solution for system validation. Therefore, there is a need for an efficient testing solution.

DETAILED DESCRIPTION

The various embodiments of the present disclosure provide automated double Pulse Test (DPT) measurements with a reverse recovery plot for system validation of Wide Band Gap (WBG) power devices during in-circuit operation.

Measurement of reverse recovery characteristics depends heavily upon the acquisition accuracy. With industry leading probes developed by Tektronix, such as the Iso-Vu probes and Tektronix current probes (TCP), systems can measure reverse recovery characteristics close to the device's real characteristics. The embodiments here have several advantages. These include definition of a workflow to meet and debug new designs in accordance with industry standards. Other advantages include automated measurements with validation and feedback, automation of the source instrument, test and measurement instrument and the device under test (DUT), and flexibility with custom reference levels and configurable integration points in measurement. Additional advantages include a new plot type for reverse recovery representation with time sliced overlapping capability, per cycle analysis with annotation, and control of single and multiple pulse results and statistics.

The WBG test and measurement instrument based solution of the embodiments offers flexibility in the workflow and performs complex measurements. These standards may include, without limitation, those set out by various standard-setting bodies, such as JEDEC (Joint Electronic Device Engineering Council) and IEC (International Electrotechnical Commission). The present solution (WBG-DPT) is very useful to the designers and validation teams.

Power-electronic systems involve switching of power semiconductor devices (PSDs) by applying control signals in order to control the flow of current. The dynamic performance of the PSDs has a significant impact on the efficiency and power density of power converters and other power-electronic systems.

Figure 1:
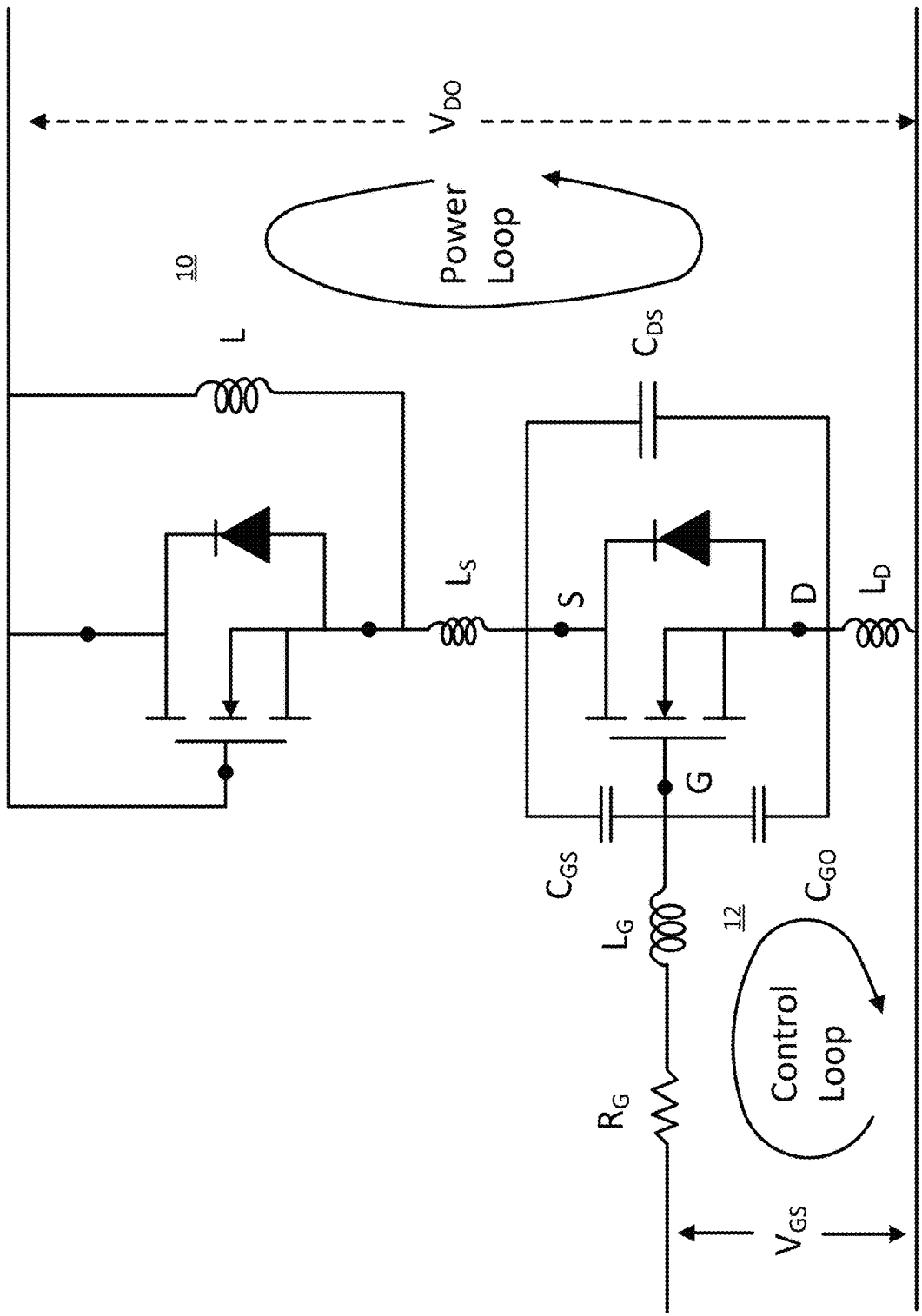
FIG. 1 shows a circuit diagram of parasitic elements in DPT power circuits.

FIG. 1 shows the two primary parasitic loops in the DPT power stage, the power loop 10 and control loop 12. LS and LD are stray inductive elements in the main power loop. LG is the parasitic inductance associated with the gate loop. Parasitic capacitances in the MOSFET, CGS, CGD, and CDS contribute to slower switching, increasing the switching losses. The LD and LG are key contributors of parasitic ringing, but the ringing due to fast switching is more sensitive to LD. This results in system validation in-circuit testing becoming critical for designers, which otherwise overlooks the PCB effects during characterization.

The DUT is customized based on target applications. The PCB board is designed to be compact and minimize the effects of the circuit parasitic and its loops that affect the dynamic performance of the packaged board. The fast-switching WBG(s) have high sensitivity to the circuit parasitic, so it is critical to measure DPT switching and diode recovery parameters during in-circuit operation as part of system validation. The information obtained from DPT analysis helps in predicting board thermo-electric performance, very valuable in validating target application designs.

Figure 2:
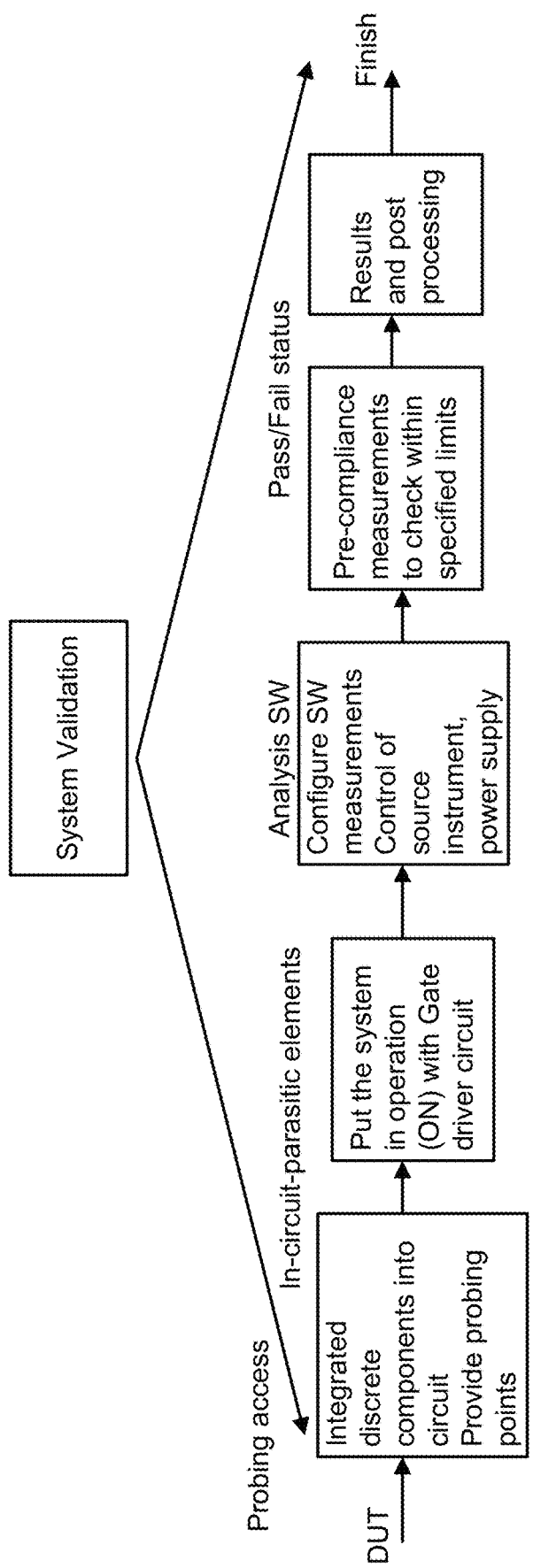
FIG. 2 shows a schematic flow diagram of board validation flow.

FIG. 2 shows an embodiment of a workflow of a validation from reference designs to end product. The device under test (DUT) has integrated discrete components into the test circuit with provided probing points. The system gets put into operation, typically by application of power from a power supply. The test software sets up the pulse(s) to apply to the DUT. This may involve a source instrument, such as an arbitrary waveform generator (AFG), or other waveform source. The DUT then undergoes testing and analysis to ensure it complies with the desired results and/or standards. Analysis of the results and any post-processing then finishes the test.

Figure 3:
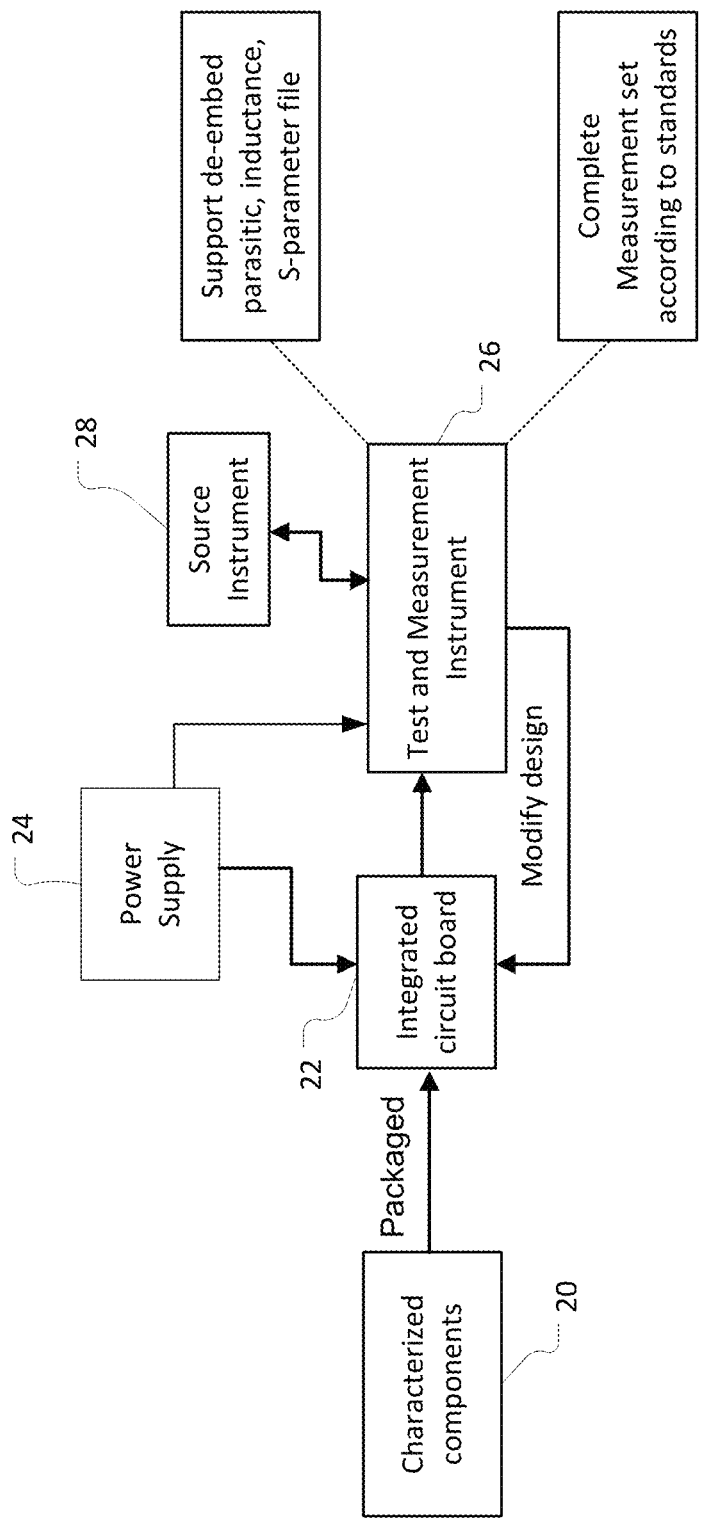
FIG. 3 shows an embodiment of a schematic flow diagram of workflow.

FIG. 3 show a workflow using the embodiments. The embodiments provide an automated process with minimal user intervention. The packaged characterized components 20 are mounted to the integrated circuit board/PCB 22. The power supply 24 turns on to provide power and the source instrument, such as an AFG, 28 provides the pulses used for testing. The test and measurement instrument 26 supports the de-embedding of the parasitic, inductance, the S-parameter file, and has complete measurement sets in accordance with industry standards.

One should note that the discussion focuses on an AFG as the source instrument, and an oscilloscope, or scope, as the test and measurement instrument, but this discussion uses these for ease of understanding and does not intend to limit these elements to those particular examples in any way.

Figure 4:
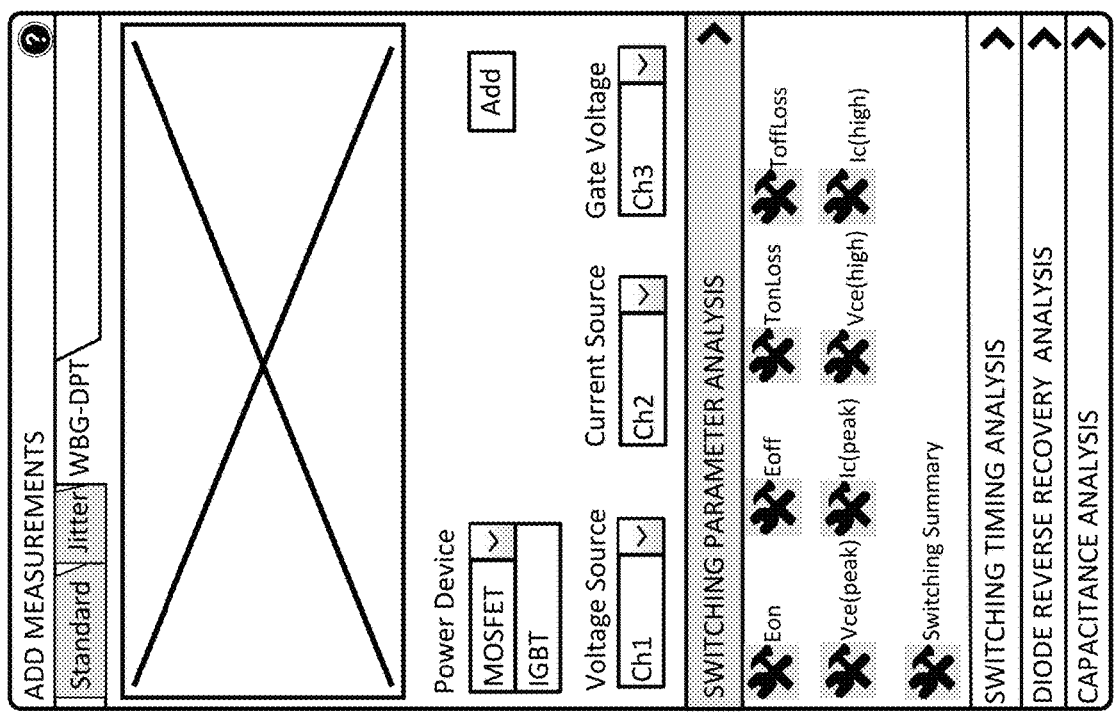
FIG. 4 shows an embodiment of a measurement grouping of DPT flow.

The embodiments here allow for a myriad of measurements for WBG devices. FIG. 4 shows a user interface showing grouping of such measurements. As can be seen, the user interface presented by the test and measurement interface in this embodiment allows for selection of the type of device, either a MOSFET (metal oxide semiconductor field effect transistor) or an insulated gate bipolar transistor (IGBT), both examples of wide-bandgap devices. The test and measurement instrument supports multiple power devices including, but not limited to, silicon carbide (SiC) and gallium nitride (GaN) MOSFETs, silicon devices, and GaN-HEMT (high electron mobility transistor) devices. The user can select the voltage and current source channels and the gate voltage channel. The user may also pick from one of several tests using the test set up. These include, as examples, switching parameter analysis, switching timing analysis, diode reverse recovery analysis, and capacitance analysis.

Figure 5:
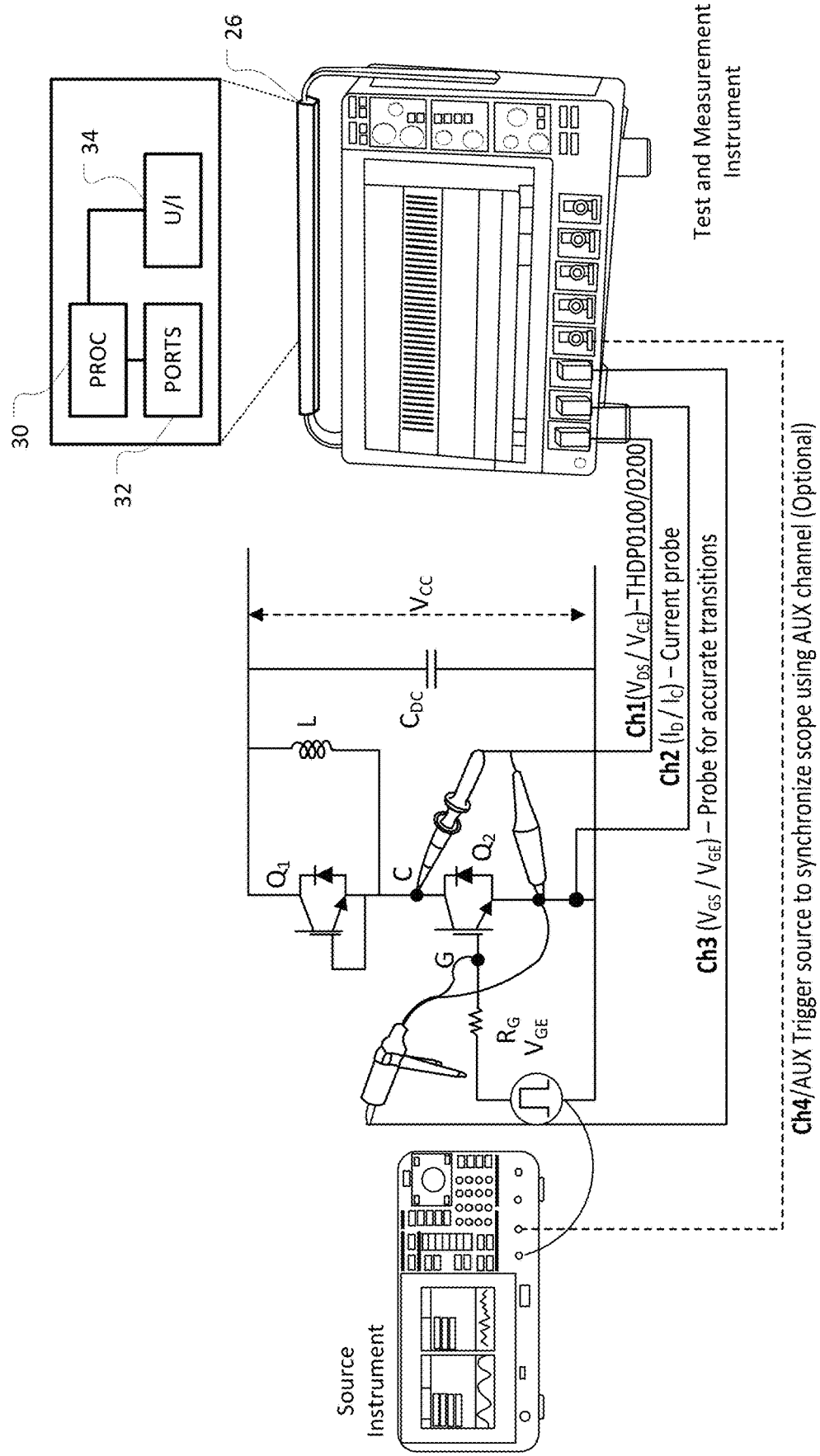
FIG. 5 shows an embodiment of a schematic circuit diagram showing test points to measure switching parameters.

FIG. 5 shows an embodiment of a switching parameters measurement scenario. The semiconductor DUT resides in the low-side position (Q2) along with a freewheeling diode (FWD) in high-side position (Q1) forms the switching cell under test.

Probes from the test and measurement instrument 28 capture the switching voltage and current, along with the gate voltage of Q2. The configuration of probe connections to the test and instrument device 26 merely constitutes an example. The probes connect to the test and measurement instrument through ports 32, which in turn transfer data to the processor 30. The user interface 34, upon which the menu such as that shown in FIG. 4, allows the user to interact with the testing process. The user interface here comprises a touch screen embodiment, but could comprise any combination of display and controls, such as knobs or buttons. The processor may comprise one or more processors that execute code to cause the one or more processors to perform the methods of the embodiments.

As seen in the diagram, an optional connection exists between the source instrument and the test and measurement instrument. The activation of the DUT, as used here, means application of power from the power supplies and then the application of the pulses form the source instrument. The application of the source instrument may occur synchronized to the test and measurement instrument using the optional connection/communication channel.

This system allows for automation of the DPT process, but still allows for variations. For example, the system may automatically set the pulse region for the second pulse in accordance with one of many industry standards. However, the user has the flexibility to change the pulse region based on their DUT operation. With the 'automatic' selection, the user does not have to perform any setup for anything in the measurement configuration. The automatic setting performs both validation, and measurement on the waveform.

Figure 7:
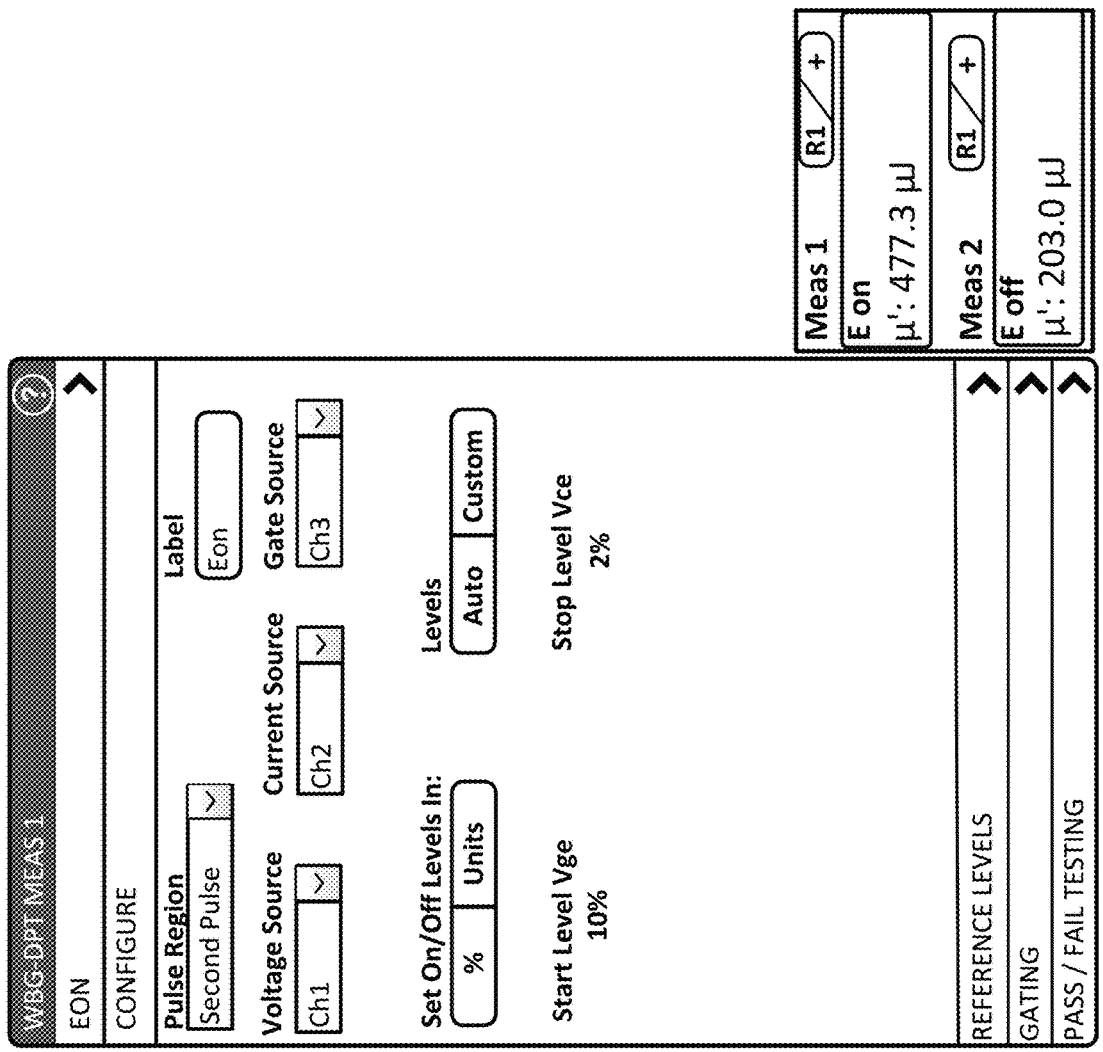
FIG. 7 shows an image of an Eon configuration and results badge on an embodiment of a WBG-DPT solution.

For the user-selectable settings, FIG. 7 shows an embodiment of a menu for these, the measurement may fail if the user neglects to put in the second pulse region. In this case, the measurement fails and the user will get feedback in the results badge. For example, if second pulse region is not present, user will be notified, as 'Valid Eon region is not present on second pulse . . . '

Figure 6:
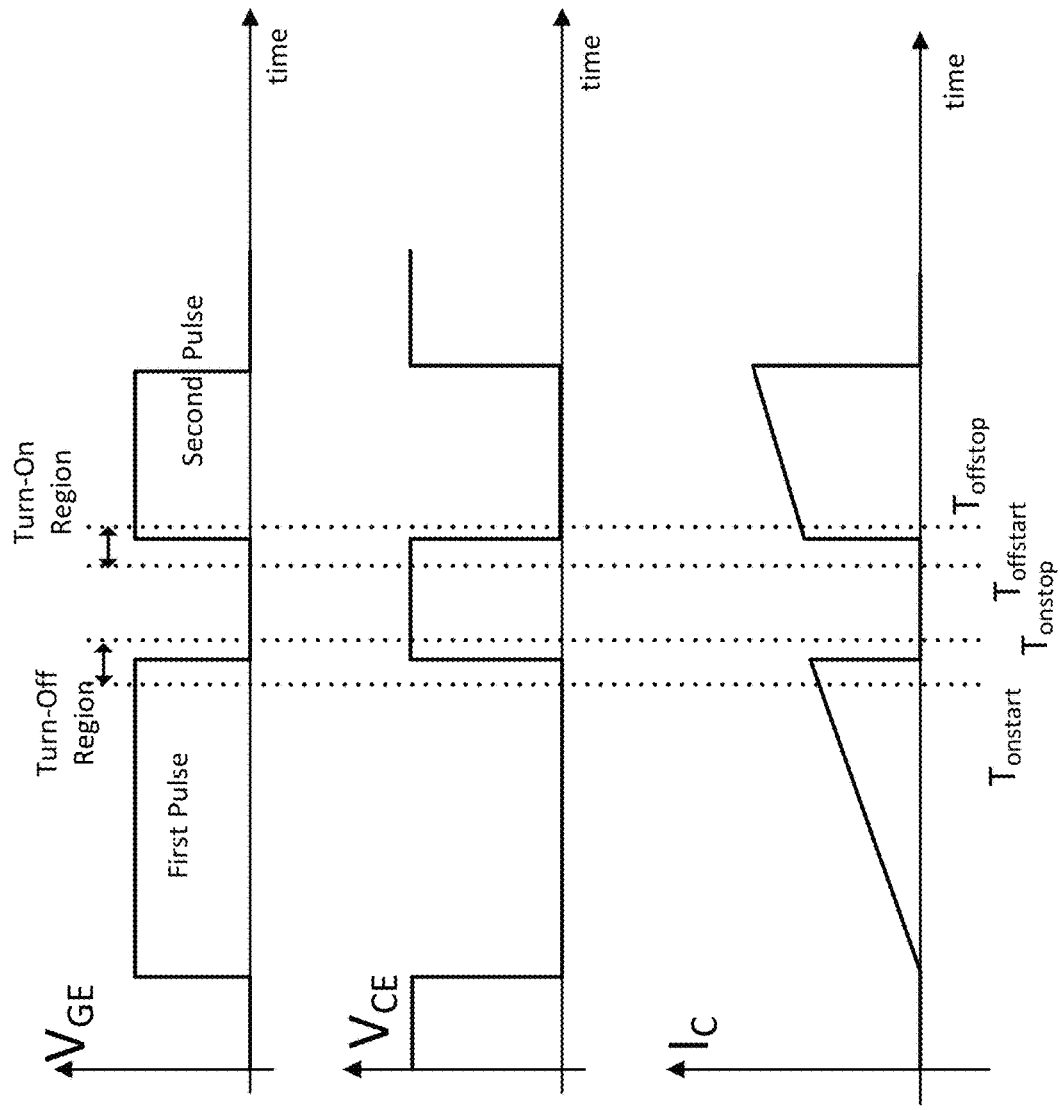
FIG. 6 shows an embodiment of turn On-Off transitions in an insulated gate bipolar transistor (IGBT).

Using an IGBT as an example, one can calculate the turn-on and the turn-off parameters by looking at the falling edge of the first pulse and the rising edge of the second pulse, as shown in FIG. 6. One switching parameter analysis measures the energy dissipated inside the IGBT during the turn-on of a single collector current pulse described in the following equation:

$$E_{on}\int_{Tonstart}^{Tonstop} V_{CE} I_C dt \quad (1)$$

Energy dissipated inside the IGBT during the turn-off time plus the tail time of a single collector current pulse.

$$E_{off}\int_{Toffstart}^{Toffstop} V_{CE} I_C dt \quad (2)$$

Figure 8:
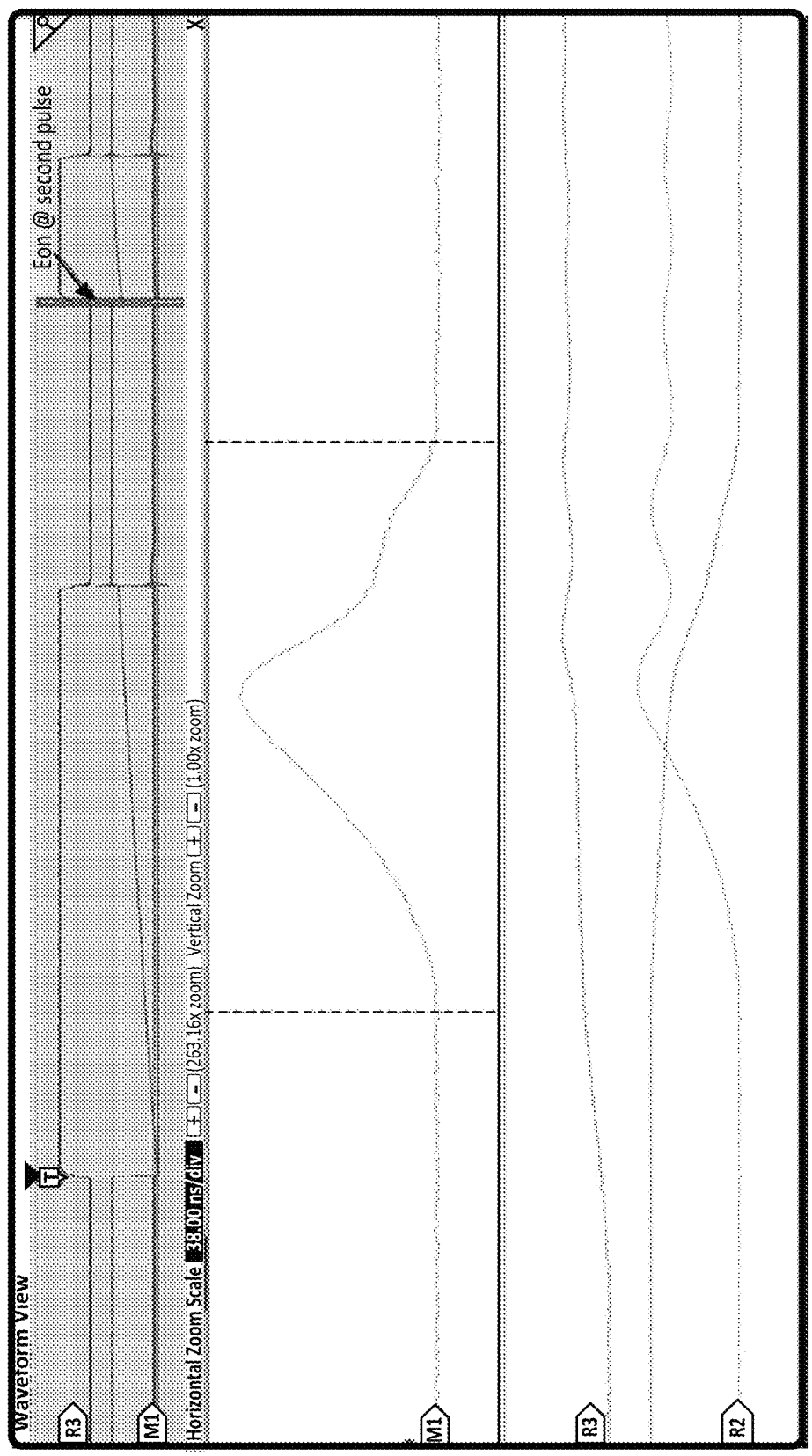
FIG. 8 shows an annotated Eon region using and embodiment of a WBG solution on an oscilloscope with navigation.

FIG. 8 shows an embodiment of a resulting waveform having an annotated Eon region, and the user can navigate the waveform by scrolling and zooming to see details of the waveform data displayed.

The one or more processors in the test and measurement instrument provide capabilities to increase the accuracy of measurements by performing signal conditioning on the incoming waveform data. The incoming data from the DUT will typically be analog signal data that undergoes analog-to-digital conversion prior to analysis. Signal conditioning may include voltage or current limiting, applying anti-aliasing filters, amplification, filtering, and many others. The signal conditioning will typically mitigate the effects of noise to ensure that measurements have higher accuracy than they would have without signal conditioning. Other noise control techniques may include the use of a hysteresis band control loop or filter.

In addition, while the above discussion mentions the user input identifying the analysis to be performed by the DUT as a user-entered input, the user input could also comprise a user providing an automated script or other form of programming using a programmatic interface to perform the testing and analysis in an automated fashion. This is true for all aspects of the DPT testing, including reverse recovery discuss below.

Figure 9:
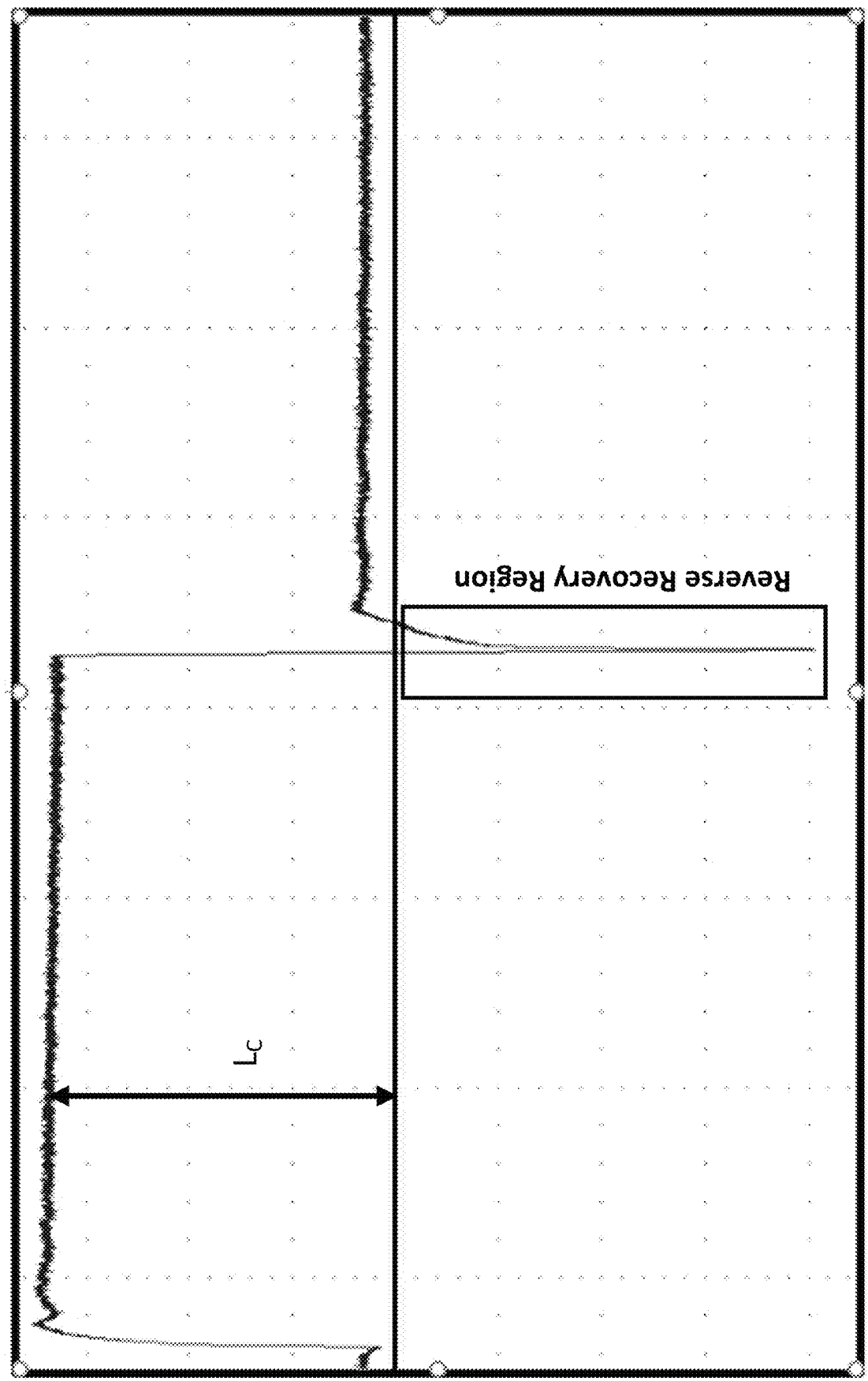
FIG. 9 shows an image of reverse current captured on an oscilloscope using Tektronix current probes (TCP) in an embodiment of a reverse recovery process.
Figure 10:
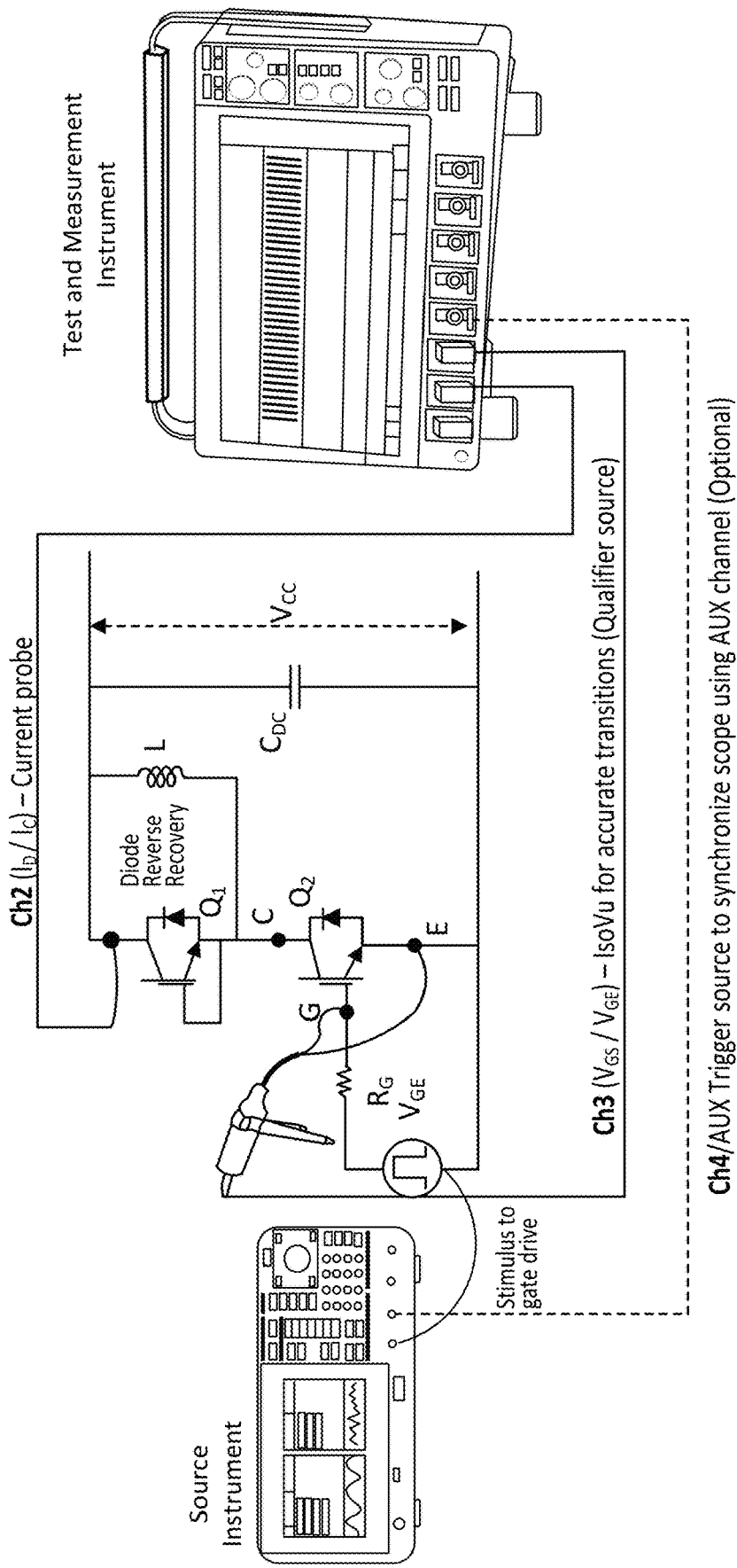
FIG. 10 shows an embodiment of schematic circuit diagram showing test points to measure diode reverse recovery.

During the start of second pulse of double pulse testing, the freewheeling diode that will be in forward conduction mode switches to reverse blocking mode. Current in the diode will dip below zero and recover back to 0 ampere at this time, as shown in FIG. 9. Time taken by the system to recover back to 0 ampere, referred to as the reverse recovery time, Trr, and the resulting recovery charge, Qrr, comprise a few of the important reverse characteristics for the system to analyze. Using the embodiments, the user can perform the Trr measurement with a single current waveform or can use gate-source voltage as edge qualifier. FIG. 10 shows an embodiment of a test setup.

The reverse recovery time can be found using the formula:

$$Trr = ta + tb \quad (3)$$

where $t_a$ is the time taken for reverse current fall to reach maximum reverse current from 0 ampere during second pulse, and $t_b$ is the time at which extrapolated tangent drawn on rise of reverse current towards 0 ampere intercepts zero current axis.

After the user provides appropriate inputs to measurement, ta is determined using robust edge detection technique on the waveform with the edge at zero ampere within a hysteresis band. For tb, a tangent line is drawn for reverse time analysis at recovery of the reverse current from its maximum reverse current towards zero current axis. In some standards, this tangent should be passing through 90% and 25% points of the maximum reverse current (Irm). For a novice user, the solution provides automatic levels configured by the oscilloscope according to the industry standards.

Since recovery of current can happen very abruptly or softly based on system, the ability to configure these percentage levels has value. In the embodiment of the WBG solution, the user can configure this tangent line to pass though different start and end percentages of Irm. The line equation passing through A % and B % of Irm at instance t1 and t2 respectively is found by:

$$I(t) = \frac{Irm*\left(\frac{B-A}{100}\right)}{(t2-t1)}t + \frac{\left(\frac{(t1*B-t2*A)}{100}*Irm\right)}{(t1-t2)} \quad (4)$$

Time at which this tangent line intercepts zero current axis is at:

$$tint = \left(\frac{(t1*B-t2*A)}{B-A}\right) \quad (5)$$

Using this intercept time, the tb reverse recovery time is found by subtracting tint with the time at which current reached Irm (trm).

$$tb = tint - trm \quad (6)$$

Figure 11:
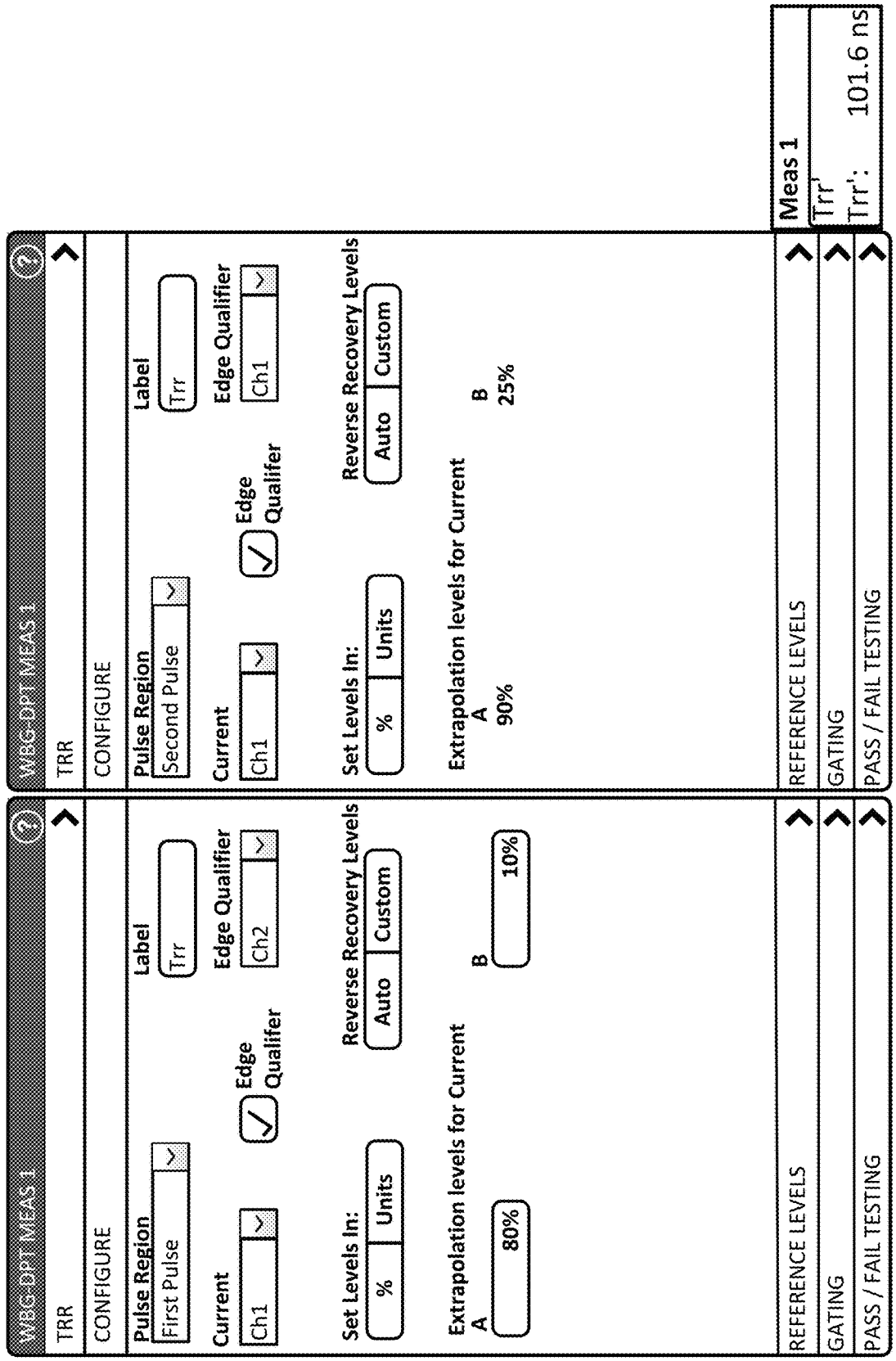
FIG. 11 shows a reverse recovery time (Trr) configuration page and measurement badge on an embodiment of a WBG-DPT solution.

As noted from equation 5, tint is independent of Irm. As the configuration of start and end points of the tangent line varies, total reverse recovery time (Trr) varies. This novel configuration facility provides a powerful tool for analyzing non-linear reverse recovery region based on visual feedback and scope measurement feedback. In the embodiments here of a WBG solution, the points through which the line should pass can be provided as absolute values or as percentage of Irm. These configurations will help engineers to judge the nature of recovery of current and quantify them with measurement results. FIG. 11 shows an embodiment of a user interface that allows a user to select the extrapolation levels for the current for the first and second pulse, if the user selects Custom, or uses the automatic values, if the user selects Auto. FIG. 11 also shows the measurement badge with the Trr measurement.

Figure 12:
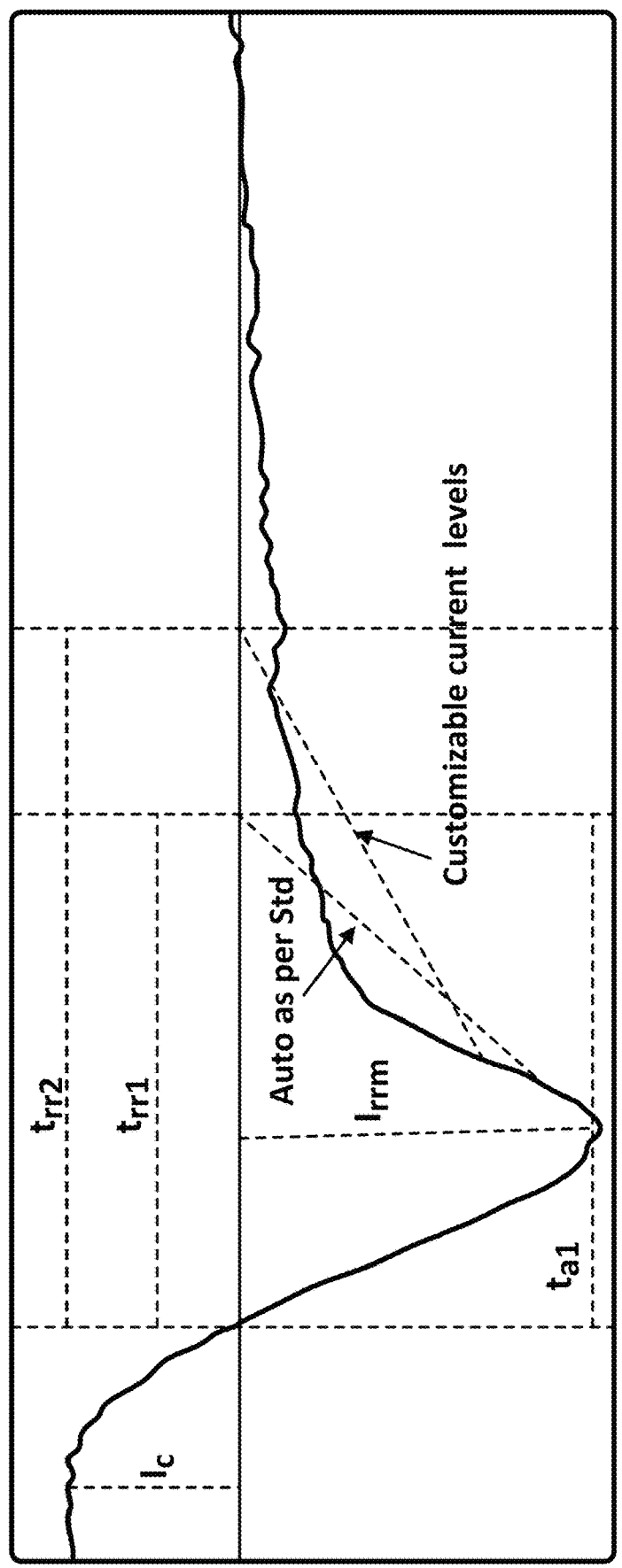
FIG. 12 shows a reverse recovery region annotated on waveform using an embodiment of a WBG-DPT solution.

Further, since reverse recovery time parameters comprise time sensitive information, the proposed solution will provide a new plot in the application called a reverse recovery plot. FIG. 12 shows the captured waveform. The process zooms into the waveform by finding reverse region automatically and annotates the relevant reverse characteristic parameters annotated as shown. The embodiments find the reverse region on the captured waveform with help of the edge technique and measurement settings. After plotting the zoomed version of waveform, the scope will mark the region of interest with dashed lines and annotate appropriate reverse recovery characteristics.

Conventional solutions to not have the ability to zoom automatically to the reverse recovery region and annotate them with parameters like Irm, time taken to reach Irm (ta), intercept of time axis by tangent (tb), total reverse time (trr) and other relevant parameters which decide the reverse recovery time of the system.

Reverse recovery charge is an important parameter to determine the reverse characteristic of system. Recovered charge, Qrr, can be approximated by area under the reverse current-time curve. This charge region represents energy that must be dissipated with reverse voltage in the power switching side of the circuit. The user should provide a reverse current waveform as input to this measurement and has an option to provide gate voltage as the edge qualifier, since gate source is usually cleaner because they are directly from IC.

Figure 13:
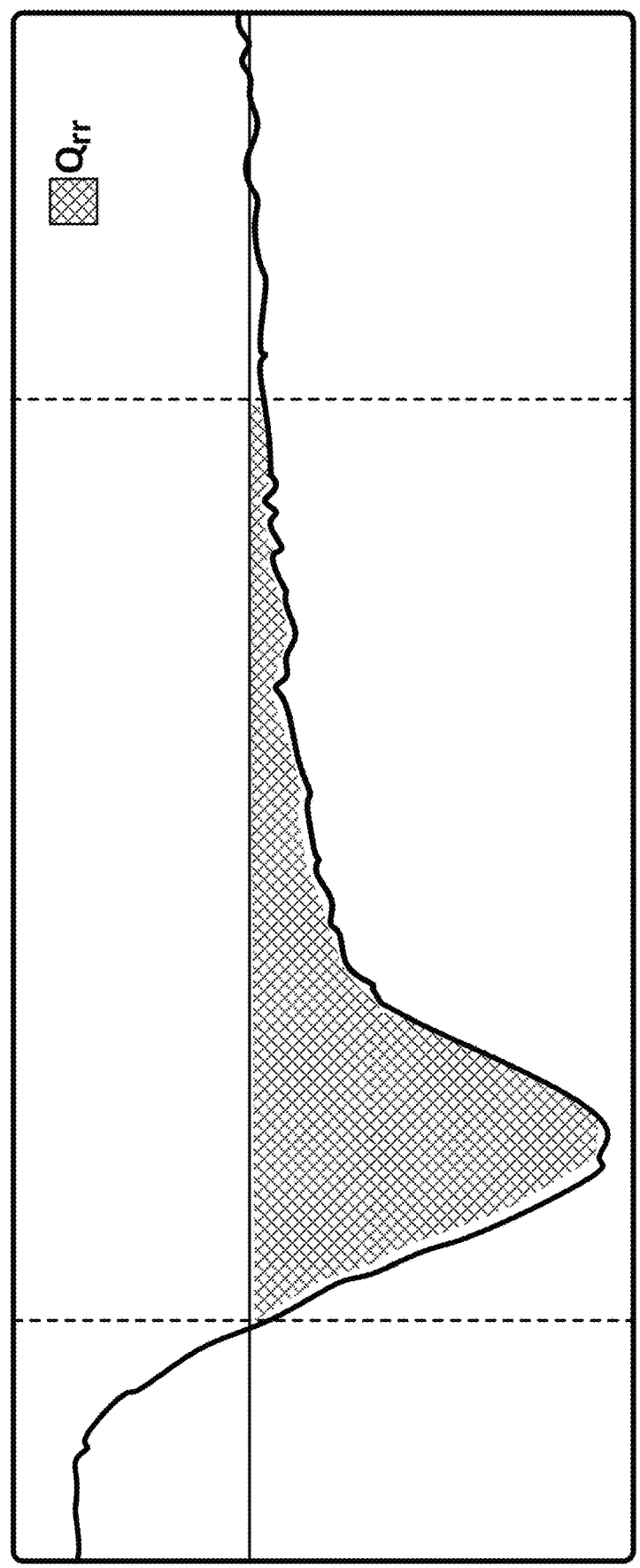
FIG. 13 shows an embodiment of a recovered charge region zoomed and annotated.

Qrr is defined as the integral of the reverse current flowing, as shown in FIG. 13, through the diode during a second pulse of double pulse testing:

$$Qrr = \int_{t_0}^{t_0+t_i} irr \times dt \qquad (7)$$

Where, $t_0$ is the time at which reverse current drops below zero current axis during second pulse, and $t_i$ is the integration time up to which reverse charge to be found.

The integration time to find the reverse charge will depend on Irm. This integration time is found by sweeping current waveform until current reaches certain percentage of Irm during rise of current towards zero current axis. Some industry standards set the latter percentage of Irm at 2% during recovery towards zero current axis.

Since each system design has its own tolerance over reverse charge, solution has the facility to configure integration time (ti) by providing percentage of maximum reverse current (Irm). This novel configuration capability caters to non-linear recovery region analysis. In the embodiments of the WBG solution, the Irm value up to which integration should be done can be provided as absolute values or as percentage of Irm. The new reverse recovery plot for this measurement will identify reverse recovery region from captured waveform, annotate the time considered for integration in equation (7) and fill the total charge area.

Figure 14:
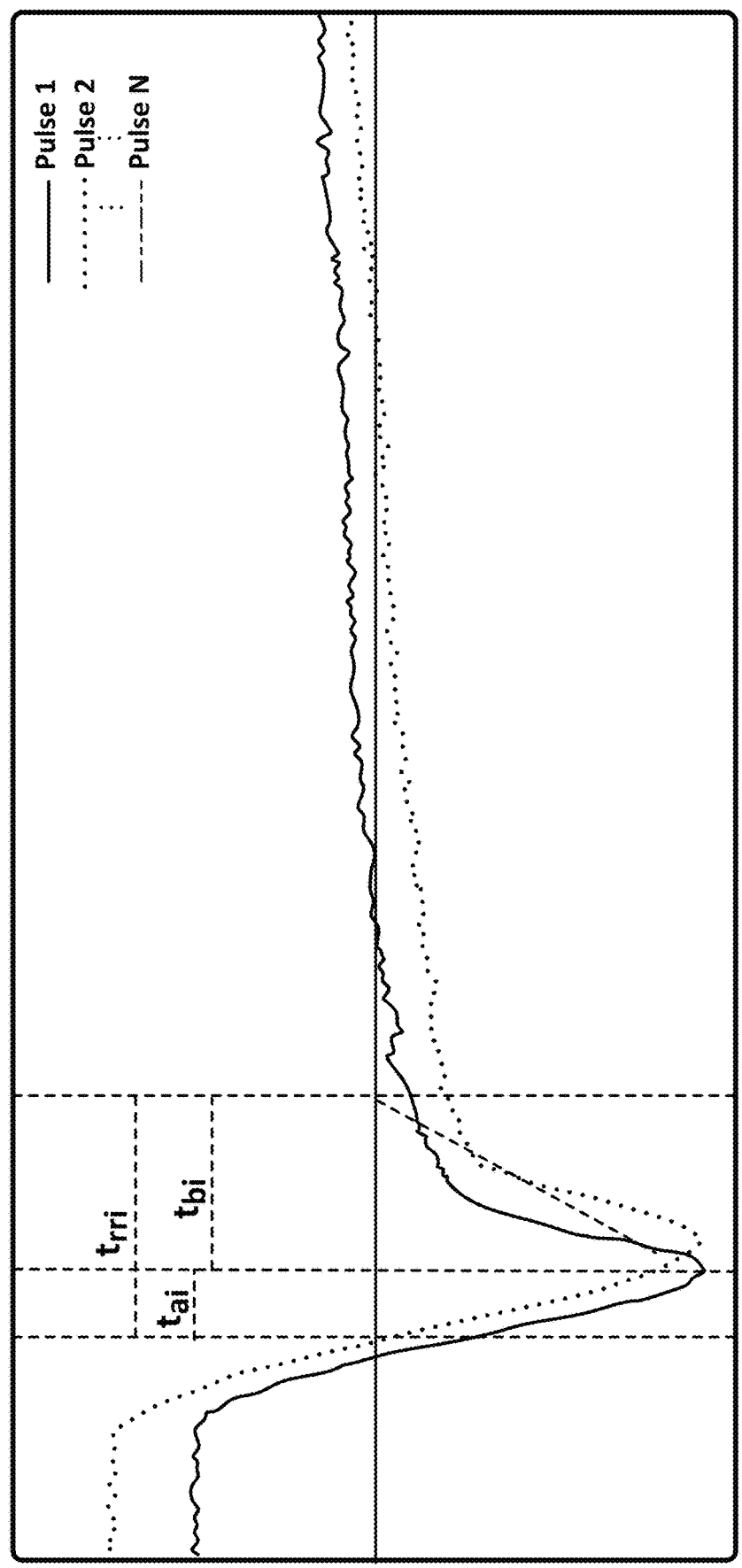
FIG. 14 shows an embodiment of an overlapped reverse recovery plot for multiple pulses.
Figure 15:
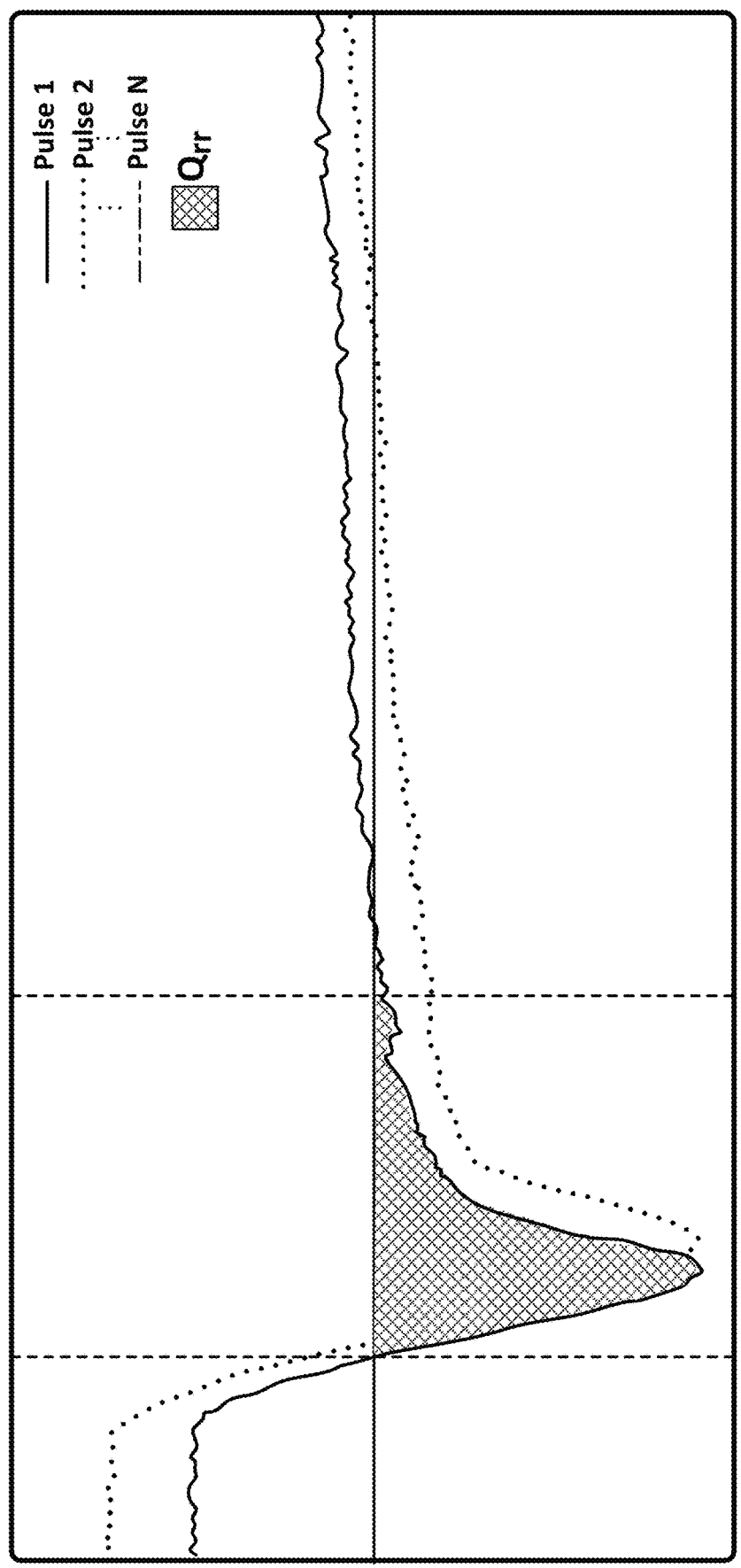
FIG. 15 shows an embodiment of an overlapped recovered charge region for multiple pulses on reverse recovery plot.

A unique approach of new reverse recovery plot is its capacity to consider multiple double pulse sets and provide visual and measurement results on each set. The user can configure measurements in WBG solution to query results on every first or second pulse or all pulses of double pulse set. In case of multiple pulses, the edge qualifier waveform provided to measurement is used as reference to find the pulse position. FIG. 14 shows an example of a display of multiple reverse recovery plots and multiple reverse recovery regions. One should note that while the plots only show Pulse 1 and Pulse 2, as noted in the legend, there may be up to N pulses. A measurement badge or legend will show current pulse results along with average results of all the pulses. In the reverse recovery plot of FIG. 14, the time region annotated for current annotated region is for Pulse 1, the solid line. FIG. 15 shows multiple plots with a reverse recovery region.

Figure 16:
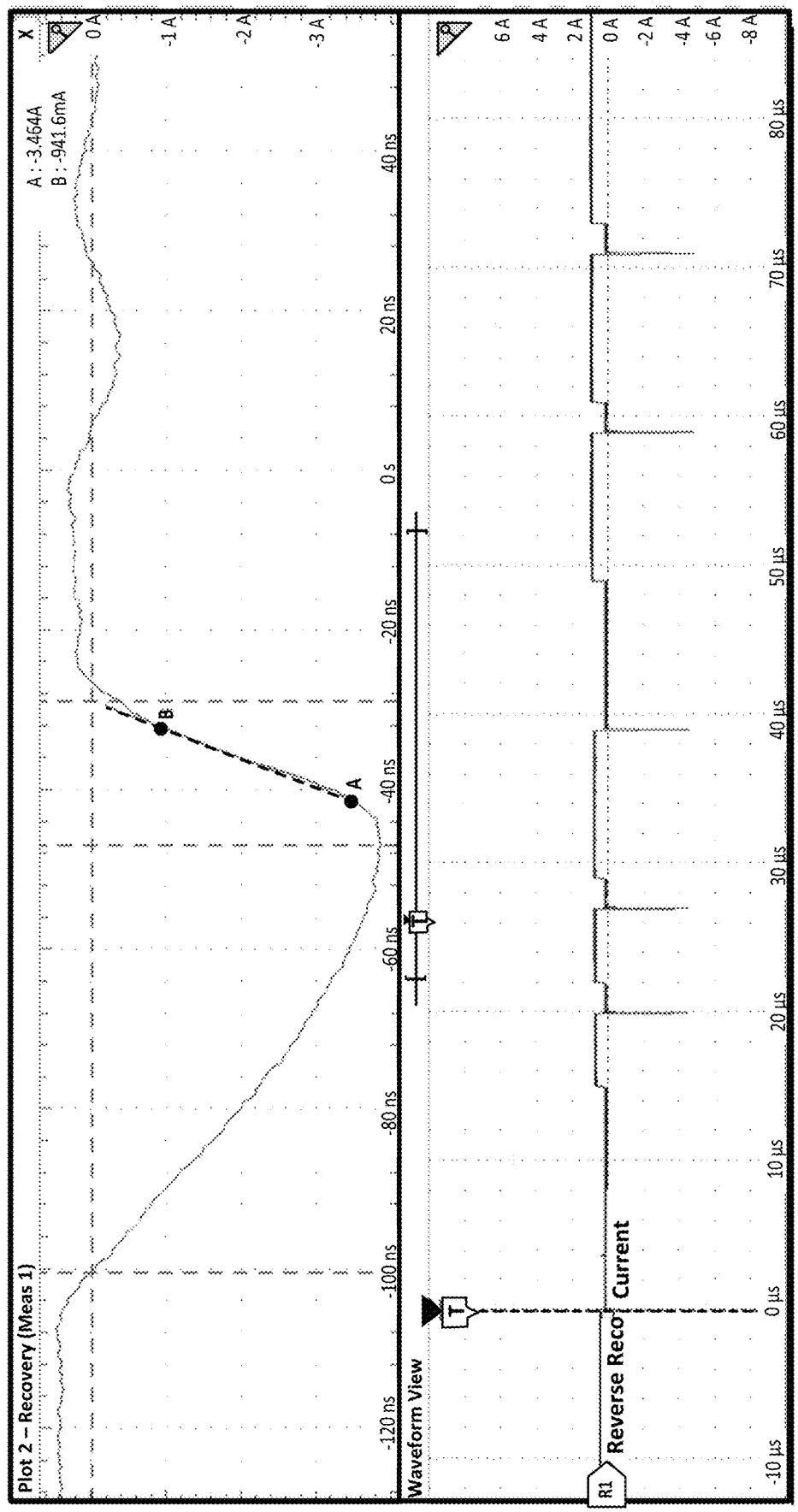
FIG. 16 shows a single reverse recovery plot and its corresponding waveform from an embodiment of performing reverse recovery testing.
Figure 17:
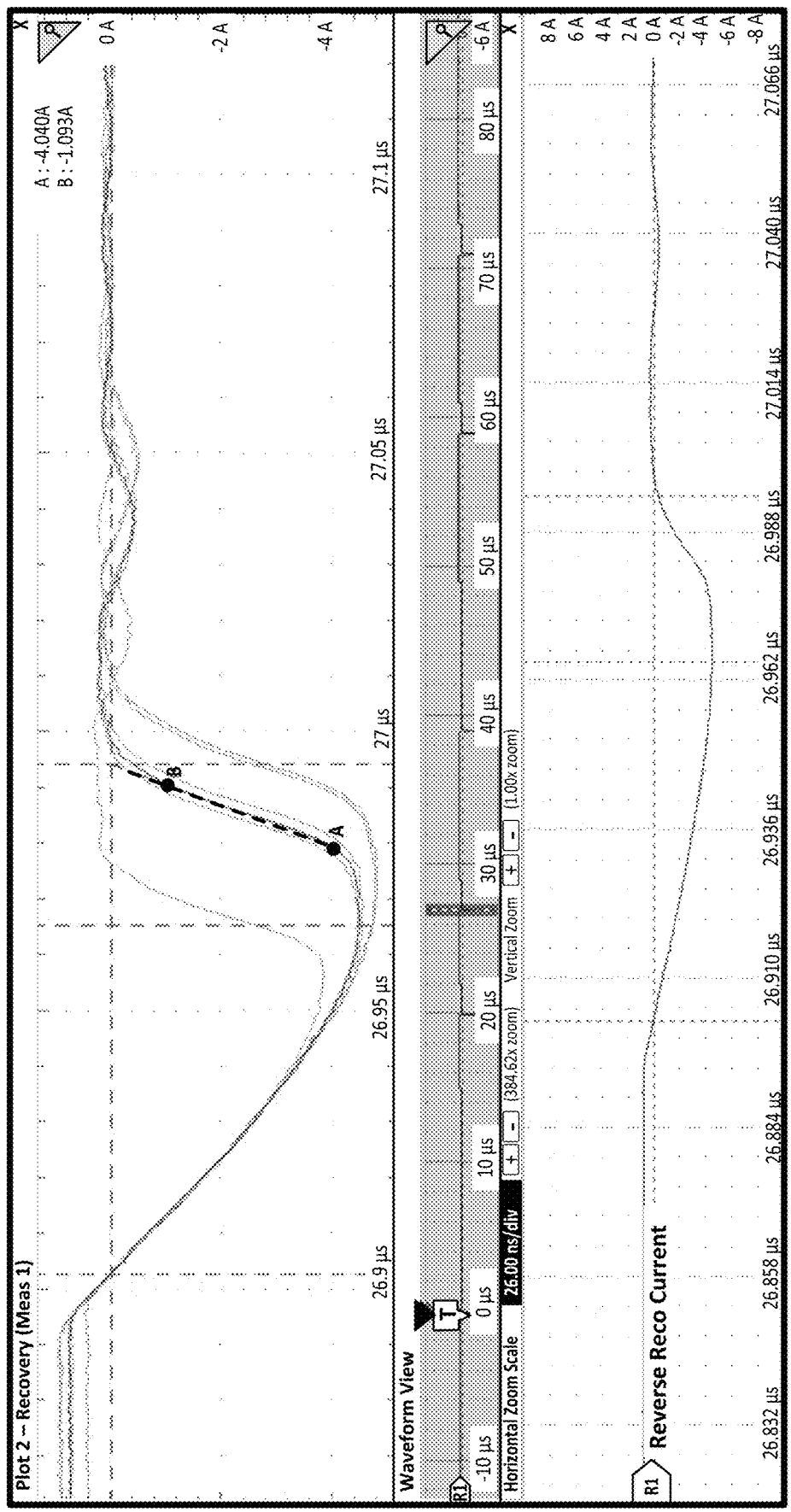
FIG. 17 shows multiple reverse recovery plots, the corresponding waveform and the reverse recovery current resulting from an embodiment of performing reverse recovery testing.

FIGS. 16 and 17 shows embodiments of plots with their corresponding waveforms and the reverse recovery current. FIG. 16 shows a single plot and FIG. 17 shows multiple plots.

The embodiments of the WBG application render multiple pulses on a single plot annotating reverse current (Irr) recovery region along with other recovery region in background for comparison. Since there are multiple regions of interest in one acquisition, the instrument uses single current waveform to slices each region of interest and overlap them in the plot. The instrument also has the capability to display multiple regions from multiple plots as an overlay as shown in FIG. 17. The multiple regions may result from a signal acquisition or from multiple acquisitions.

The user interface allows the user to navigate the waveform. In addition to zooming into a region of interest, the user can filter the results by selecting the first pulse, second pulse, every odd pulse, every even pulse, multiple pulses other than odd and even, etc. The navigation allows the user to move to the next, previous, minimum, maximum, etc. As the user navigates the annotations update to reflect the zoomed region. Highlighting of the zoomed region of interest may involve using a different color, bolding the line, etc. The instrument also has the capability to analyze the signals in both the forward direction (left to right in the figures), and the backward direction (right to left in the figures) to handle oscillation at the region of interest.

This new plot type in the oscilloscope will provide overlay of multiple varying-time sliced wave from a single waveform. This plot also provides the ability to navigate each of these region and measurement results on the scope updates accordingly. No oscilloscope application presently exists in the market that can provide such a navigation feature on a single waveform containing multiple reverse regions highlighting reverse characteristics.

Further extension of this reverse recovery plot is to provide configurable visual masking limits so that every reverse region is under specific limits. The scope will run measurement and notify on any limit violation. This masking feature on plot will be helpful in maintaining ideal reverse recovery region of system limiting maximum recovery time, maximum reverse current etc.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is test and measurement instrument, comprising: a user interface; one or more probes to connect to a device under test (DUT); and one or more processors configured to execute code to cause the one or more processors to: receive waveform data from the DUT after activation of the DUT by application of power from a power supply, and application of at least a first and second pulse from a source instrument; locate one or more reverse recovery regions in the waveform data; determine a reverse recovery time for the DUT from the reverse recovery region; and display a reverse recovery plot of the one or more reverse recovery regions on the user interface, the reverse recovery plot being automatically configured to display one or more of the reverse recovery regions, and including at least one characteristic for the one or more reverser recovery regions annotated on the reverse recovery plot.

Example 2 is the test and measurement instrument of Example 1, wherein the one or more processors are further configured to receive a user input designating a configuration for determination of the reverse recovery time.

Example 3 is the test and measurement instrument of Example 2, wherein the user input is one of an automatic setting for extrapolation levels, or user-designated settings for extrapolation levels, the extrapolation levels used for a tangent line.

Example 4 is the test and measurement instrument of Example 3, wherein the code to cause the one or more processors to display a reverse recovery plot comprises code to cause the one or more processors to display at least one of the tangent line resulting from the automatic setting and the tangent line resulting from user-designated settings.

Example 5 is the test and measurement instrument of any of Examples 1 through 4, wherein the code to cause the one or more processors to display the reverse recovery plot comprises code to cause the one or more processors to display the reverse recovery plot with a legend.

Example 6 is the test and measurement instrument of any of Examples 1 through 5, wherein the one or more processors are further configured to execute code to cause the one or more processors to determine a recovered charge from the one or more reverse recovery regions.

Example 7 is the test and measurement instrument of Example 6, wherein the code to cause the one or more processors to display the reverse recovery plot comprises code to cause the one or more processors to display the recovered charge as a recovered charge region for the one or more reverse recovery regions.

Example 8 is the test and measurement instrument of Example 6, wherein the code to cause the one or more processors to determine a recovered charge comprises code to cause the one or more processors to use a predetermined percentage of maximum reverse current.

Example 9 is the test and measurement instrument of Example 6, wherein the code to cause the one or more processors to determine a recovered charge comprises code to cause the one or more processors to present a user interface for a user to input a desired percentage of maximum reverse current.

Example 10 is the test and measurement instrument of any of Examples 1 through 9, wherein the code to cause the one or more processors to display the reverse recovery plot for one or more reverse recovery regions comprises code to cause the one or more processors to display multiple reverse recovery regions.

Example 11 is the test and measurement instrument of Example 10, wherein the code to cause the one or more processors to display multiple reverse recovery regions comprises code to cause the one or more processors to display multiple reverse recovery regions as an overlay, wherein the overlay comprises one of an overlay of each reverse recovery region with a zoomed region highlighted and annotated with a tangent line, an overlay of multiple reverse recovery regions from within a single acquisition of waveform data from the DUT, and an overlay of multiple reverse recovery regions from multiple acquisitions of waveform data from the DUT.

Example 12 is a method of providing reverse recovery measurements for a device under test (DUT), comprising: receiving waveform data through the probes from the DUT after activation of the DUT by application of power from a power supply, and application of a first and second pulse from a source instrument; locating one or more reverse recovery regions in the waveform data; determining a reverse recovery time for the DUT for the one or more reverse recovery regions; and displaying a reverse recovery plot of the one or more reverse recovery regions on the user interface, the reverse recovery plot being automatically configured to display the one or more reverse recovery regions, and including at least one characteristic of the one or more reverse recovery regions annotated on the reverse recovery plot.

Example 13 is the method of Example 12, further comprising receiving a user input designating a selection for determination of the reverse recovery time.

Example 14 is the method of Example 13, wherein the selection comprises one of an automatic setting for extrapolation levels or user-designated settings for extrapolation levels used for a tangent line.

Example 15 is the method of Example 14, wherein displaying the reverse recovery plot further comprises displaying at least one of the tangent line resulting from the automatic setting and the tangent line resulting from user-designated settings.

Example 16 is the method of Example 12, further comprising determining a recovered charge from the one or more reverse recovery regions.

Example 17 is the method of any of Examples 12 through 16, wherein displaying the reverse recovery plot comprises displaying the recovered charge as recovered charge region.

Example 18 is the method of any of Examples 12 through 17, wherein displaying the reverse recovery plot comprises displaying multiple reverse recovery regions.

Example 19 is the method of Example 18, wherein displaying multiple reverse recovery regions comprises displaying multiple reverse recovery regions and corresponding recovered charge regions.

Example 20 is the method of any of Examples 12 through 18, wherein displaying multiple reverse recovery regions comprises displaying multiple reverse recovery regions and user controls to allow the user to zoom to a selected recovery region within a series of reverse recovery region, and to allow the user to navigate the multiple reverse recovery regions to selected other recovery regions, with highlighting and annotation of the selected region.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

We claim:

1. A test and measurement instrument, comprising:
a user interface;
one or more probes to connect to a device under test (DUT); and
one or more processors configured to execute code to cause the one or more processors to:
receive waveform data from the DUT after activation of the DUT by application of power from a power supply, and application of at least a first and second pulse from a source instrument;
locate one or more reverse recovery regions in the waveform data;
determine a reverse recovery time for the DUT from the reverse recovery region; and
display a reverse recovery plot of the one or more reverse recovery regions on the user interface, the reverse recovery plot being automatically configured to display one or more of the reverse recovery regions, and including at least one characteristic for the one or more reverse recovery regions annotated on the reverse recovery plot;
wherein the one or more processors are further configured to receive a user input designating a configuration for determination of the reverse recovery time; and
wherein the user input is one of an automatic setting for extrapolation levels, or user-designated settings for extrapolation levels, the extrapolation levels used for a tangent line.

2. The test and measurement instrument as claimed in claim 1, wherein the code to cause the one or more processors to display a reverse recovery plot comprises code to cause the one or more processors to display at least one of the tangent line resulting from the automatic setting and the tangent line resulting from user-designated settings.

3. The test and measurement instrument as claimed in claim 1, wherein the code to cause the one or more processors to display the reverse recovery plot comprises code to cause the one or more processors to display the reverse recovery plot with a legend.

4. The test and measurement instrument as claimed in claim 1, wherein the one or more processors are further configured to execute code to cause the one or more processors to determine a recovered charge from the one or more reverse recovery regions.

5. The test and measurement instrument as claimed in claim 4, wherein the code to cause the one or more processors to display the reverse recovery plot comprises code to cause the one or more processors to display the recovered charge as a recovered charge region for the one or more reverse recovery regions.

6. The test and measurement instrument as claimed in claim 4, wherein the code to cause the one or more processors to determine a recovered charge comprises code to cause the one or more processors to use a predetermined percentage of maximum reverse current.

7. The test and measurement instrument as claimed in claim 4, wherein the code to cause the one or more processors to determine a recovered charge comprises code to cause the one or more processors to present a user interface for a user to input a desired percentage of maximum reverse current.

8. The test and measurement instrument as claimed in claim 1, wherein the code to cause the one or more processors to display the reverse recovery plot for one or more reverse recovery regions comprises code to cause the one or more processors to display multiple reverse recovery regions.

9. The test and measurement instrument as claimed in claim 8, wherein the code to cause the one or more processors to display multiple reverse recovery regions comprises code to cause the one or more processors to display multiple reverse recovery regions as an overlay, wherein the overlay comprises one of an overlay of each reverse recovery region with a zoomed region highlighted and annotated with a tangent line, an overlay of multiple reverse recovery regions from within a single acquisition of waveform data from the DUT, and an overlay of multiple reverse recovery regions from multiple acquisitions of waveform data from the DUT.

10. A method of providing reverse recovery measurements for a device under test (DUT), comprising:
receiving waveform data through one or more probes from the DUT after activation of the DUT by application of power from a power supply, and application of a first and second pulse from a source instrument;
locating one or more reverse recovery regions in the waveform data;
determining a reverse recovery time for the DUT for the one or more reverse recovery regions; and
displaying a reverse recovery plot of the one or more reverse recovery regions on the user interface, the reverse recovery plot being automatically configured to display the one or more reverse recovery regions, and including at least one characteristic of the one or more reverse recovery regions annotated on the reverse recovery plot; and
receiving a user input designating a selection for determination of the reverse recovery time, wherein the selection comprises one of an automatic setting for extrapolation levels or user-designated settings for extrapolation levels used for a tangent line.

11. The method as claimed in claim 10, wherein displaying the reverse recovery plot further comprises displaying at least one of the tangent line resulting from the automatic setting and the tangent line resulting from user-designated settings.

12. The method as claimed in claim 10, further comprising determining a recovered charge from the one or more reverse recovery regions.

13. The method as claimed in claim 12, wherein displaying the reverse recovery plot comprises displaying the recovered charge as recovered charge region for the one or more reverse recovery regions.

14. The method as claimed in claim 10, wherein displaying the reverse recovery plot comprises displaying multiple reverse recovery regions.

15. The method as claimed in claim 14, wherein displaying multiple reverse recovery regions comprises displaying multiple reverse recovery regions and corresponding recovered charge regions.

16. The method as claimed in claim 14, wherein displaying multiple reverse recovery regions comprises displaying multiple reverse recovery regions and user controls to allow the user to zoom to a selected recovery region within a series of reverse recovery region, and to allow the user to navigate the multiple reverse recovery regions to selected other recovery regions, with highlighting and annotation of the selected region.

* * * * *